United States Patent [19]

Sattin

[11] Patent Number: 4,792,758

[45] Date of Patent: Dec. 20, 1988

[54] STEADY-STATE ECHO MAGNETIC RESONANCE IMAGING

[75] Inventor: William Sattin, Cleveland Hts., Ohio

[73] Assignee: Picker International, Inc., Highland Hts., Ohio

[21] Appl. No.: 122,773

[22] Filed: Nov. 19, 1987

[51] Int. Cl.[4] .......................................... G01R 33/20
[52] U.S. Cl. ................................................. 324/309
[58] Field of Search .................... 324/307, 309, 312

[56] References Cited

U.S. PATENT DOCUMENTS

| | | | |
|---|---|---|---|
| 4,532,474 | 7/1985 | Edelstein | 324/309 |
| 4,587,489 | 5/1986 | Wehrli | 324/309 |
| 4,616,182 | 10/1986 | Kramer et al. | 324/309 |
| 4,716,367 | 12/1987 | Pate | 324/309 |
| 4,727,325 | 2/1988 | Matsui et al. | 324/309 |
| 4,733,186 | 3/1988 | Oppelt et al. | 324/309 |

OTHER PUBLICATIONS

"Fast Sequences", Advances in NMR Research, Picker International, Inc. literature, 1986.
"SYS-Flash. Systematic Saturation in Flash MR Imaging", by Matthaei, et al., Mag. Res. in Med., 4, 302-305, 1987.
"Rapid Images and NMR Movies" by Haase, et al., Biophysical Chemistry, pp. 980-981.
"Diffusion and Field-Gradient Effects in NMR Fourier Spectroscopy" by Kaiser, et al., Journal of Chemical Physics, vol. 60, No. 8, Apr. 15, 1974, pp. 2966-2979.

*Primary Examiner*—Stewart J. Levy
*Assistant Examiner*—Kevin D. O'Shea
*Attorney, Agent, or Firm*—Fay, Sharpe, Beall, Fagan, Minnich & McKee

[57] ABSTRACT

In a magnetic resonance imaging system, a plurality of RF pulses (24) are applied in bundles (62). The pulses in each bundle have an interpulse spacing (66) which is shorter than the T1 and T2 relaxation time of an imaged sample. The next pulse of the bundle is applied before the magnetic resonance response can build to a steady state echo. After a steady state resonance condition is reached, the application of radio frequency pulses is interrupted for an interbundle duration (72) which is sufficiently long for the steady state echo (96) to occur. Magnetic resonance imaging data is sampled during the steady state echo. Slice select gradients (34) are applied concurrently with each radio frequency pulse. In the interbundle interval, a phase encode gradient (42) and a read gradient (38) are applied. The sequence is repeated a plurality of times each with a different phase encode gradient to generate the appropriate data lines or views for transformation into an image representation.

19 Claims, 2 Drawing Sheets

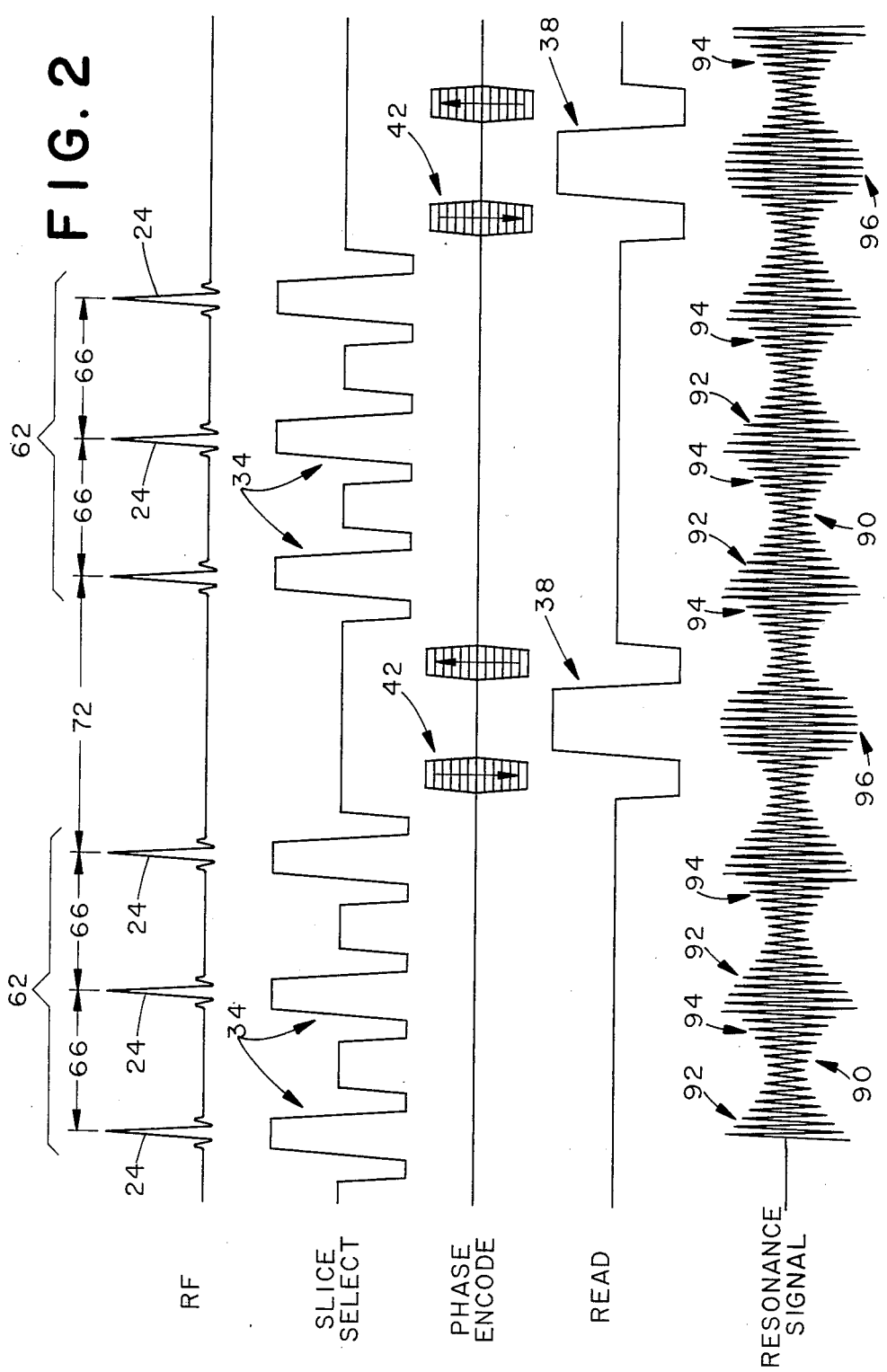

STEADY-STATE ECHO MAGNETIC RESONANCE IMAGING

BACKGROUND OF THE INVENTION

The present application is a continuation-in-part of U.S. application Ser. No. 897,118 (PKR 2 031), filed Aug. 15, 1986.

The present invention relates to the art of magnetic resonance spectroscopy. It finds particular application in conjunction with imaging body tissue and will be described with particular reference thereto. It is to be appreciated that the present invention is also applicable to slice imaging, volume imaging, motion desensitization, motion imaging, and other types of imaging and analysis of selected regions of animate and inanimate objects.

Heretofore, various imaging sequences have been utilized in medical diagnostic and other magnetic resonance imaging. Commonly, the sequences include the application of radio frequency pulses to induce or drive magnetic resonance of selected dipoles in an image region. Various magnetic field gradients were applied across the image region for spatially or otherwise encoding the magnetic resonance. These gradients commonly included phase encode, read, and slice select gradients applied along mutually orthogonal axes. In spin echo, gradient echo, and other echo techniques, magnetic resonance was excited and the magnetization vectors were focused to converge after a short time in an echo. After one or more echoes occurred, another sequence was commence with different magnetic field gradient encoding. After a sufficient number of encoded views were collected, commonly on the order of 256, the collected views were reconstructed into a magnetic resonance image representation.

The echo techniques generate excellent images. The spin echo technique, for example, generates T2 weighted images which have particularly useful diagnostic value. However, when using echo techniques, a relatively long time interval was required to collect the necessary resonance data.

Steady state magnetic resonance imaging techniques have been developed which improve or reduce the data acquisition time. In nuclear magnetic resonance spectroscopy, steady state resonance was induced by applying periodic, equal, and coherent RF pulses to a nuclear spin system. The free induction decay following each pulse was monitored and analyzed to assess selected spectroscopic data. Analogous imaging techniques have also been developed. Again, a string of periodic, equal, and coherent RF pulses were applied. Between adjacent pulses, the magnetic resonance signal decayed and started to build toward an echo. However, before an echo formed, the next RF pulse was applied. In this manner, a steady state driving of the magnetic resonance spin system was achieved. Magnetic field gradients were applied to encode spatial information and other imaging information in the steady state resonance signals. The magnetic resonance signal was sampled at a selected point between the two RF pulses. The magnetic resonance signal could be sampled closely following an RF pulse before the magnetic resonance signal has decayed too low. Alternately, the magnetic resonance could be sampled after it started building toward an echo immediately preceding the next pulse. However, time had to be accorded between the sampling point and the adjacent RF pulses to accommodate the necessary gradient field pulses. The spatially encoded resonance data was reconstructed into an image representation using Fourier transform or other known reconstruction techniques.

In another imaging technique, a saturation pulse was applied closely preceding each RF pulse to saturate the magnetic resonance signal from flowing material. Images from following gradient echoes had little or no motion artifacts. However, images were prone to artifacts from main field inhomogeneities, variations in magnetic susceptibility, proximity to ferrous objects, and the like.

Another drawback to the prior art techniques resides in the demands on the hardware for applying gradient pulses between the close radio frequency excitation pulses. Moreover, these technique suffer chemical shift, main field inhomogeneity, magnetic susceptibility variation, and ferrous object proximity degradation.

The present application provides a new and improved imaging technique which overcomes the above referenced problems and others.

SUMMARY OF THE INVENTION

In accordance with one aspect of the present invention, a method of magnetic resonance imaging is provided. A steady state resonance condition is established by applying a series of radio frequency pulses. An interpulse interval between the pulses is less than or comparable to the characteristic T2 and T1 of an examined sample. Intermittently, the radio frequency pulses are interrupted or delayed to permit an echo to occur. Magnetic resonance data is sampled during the echo. After the echo, a series of radio frequency pulses is again applied with an analogous interpulse interval to maintain the steady state. The steps of permitting a steady state echo to occur, sampling the data, and maintaining the steady state condition are repeated with a variety of magnetic field gradients. The sampled data is reconstructed into an image representation. In accordance with another aspect of the present invention, an a magnetic resonance imaging apparatus is provided. The apparatus includes a means for performing each of the above described functions and a control means for controlling the sequence and timing.

One advantage of the present invention is that it permits more freedom for selecting image contrast and data acquisition time.

Another advantage of the present invention is that it provides greater flexibility and less restrictive requirements for the application of gradient pulses. The greater gradient pulse application freedom permits the application of additional gradient pulses for dephasing, artifact reduction, and the like.

Another advantage of the present invention resides in its high signal-to-noise ratio per unit time.

Still further advantages of the present invention will become apparent to those of ordinary skill in the art upon reading and understanding the following detailed description of the preferred embodiment.

BRIEF DESCRIPTION OF THE DRAWINGS

The invention may take form in various steps and arrangements of steps and in various parts and arrangements of parts. The drawings are only for purposes of illustrating a preferred embodiment and are not to be construed as limiting the invention.

DETAILED DESCRIPTION OF THE PREFERRED EMBODIMENTS

Figure 1:
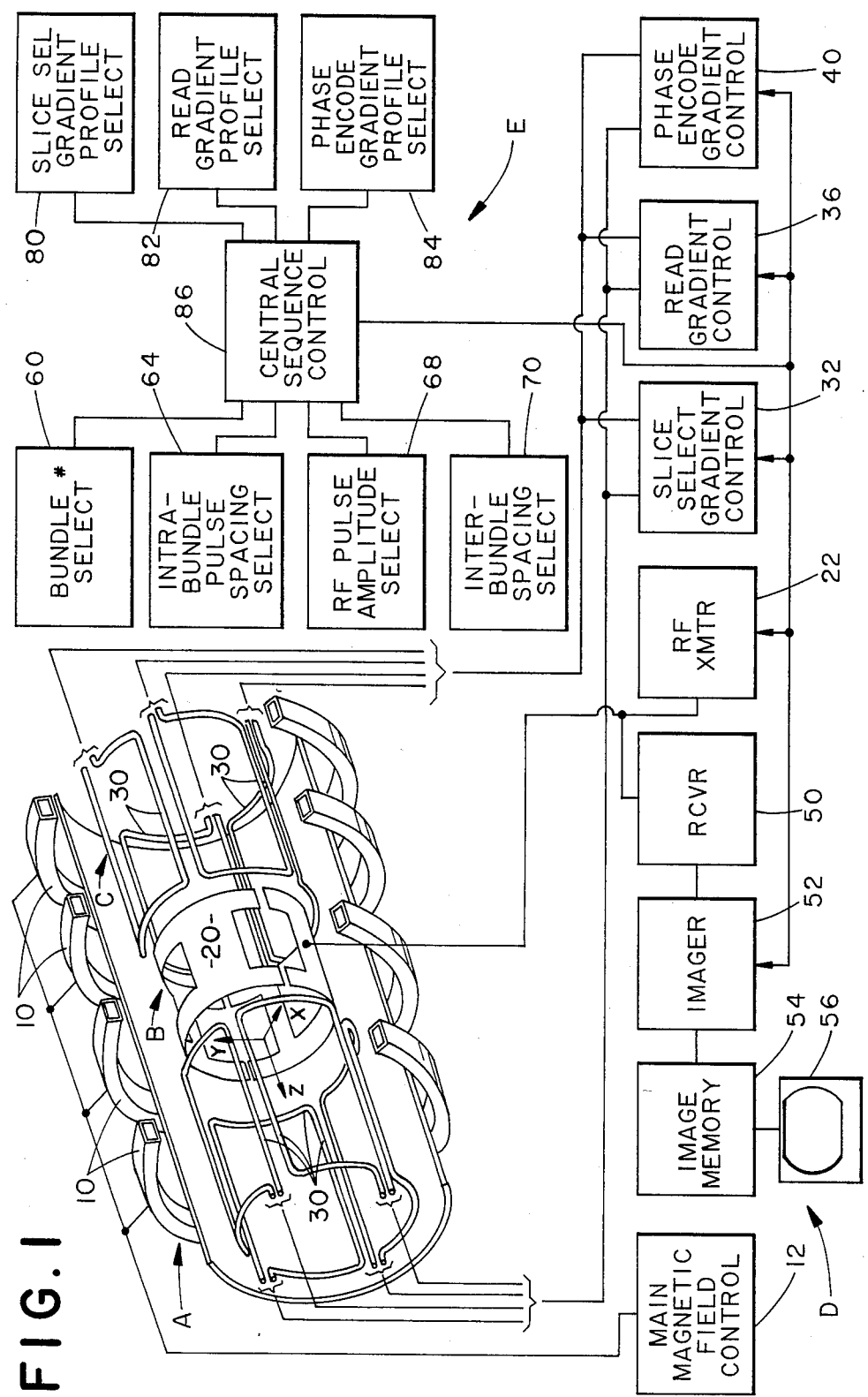
FIG. 1 is a diagrammatic illustration of a magnetic resonance imaging apparatus for implementing the present invention; and, FIG. 2 illustrates a magnetic resonance imaging sequence in accordance with the present invention.

With reference to FIG. 1, a magnetic resonance imaging apparatus includes a main magnetic field means A for generating a substantially uniform magnetic field through an image or examination region. A radio frequency means B selectively transmits radio frequency excitation pulses for exciting resonance of the magnetization vectors of selected dipoles within the image region. A gradient field means C selectively applies gradient fields, preferably along three orthogonal axes across the image region. An image means D reconstructs an electronic image representation from received magnetic resonance signals. A pulse sequence control means E controls the radio frequency means and the gradient means to cause the generation of pulse sequences in accordance with FIG. 2.

The magnetic field means A includes a plurality of magnets 10, such as conventional wound coil magnets or superconducting magnets. A control circuit 12 controls the current and power supply to conventional electromagnets such that a substantially uniform magnetic field is generated axially through the image region. For superconducting magnets, the magnetic field control circuit merely ramps up the magnetic field.

The radio frequency means B includes a radio frequency coil 20, such as a quadrature coil surrounding the image region. A resonance excitation control circuit or radio frequency transmitter 22 selectivity applies radio frequency pulses to the RF coil 20 to excite magnetic resonance in the image region. With reference to FIG. 2, the resonance excitation means 22 applies a series of radio frequency pulses 24 at intervals and with amplitudes controlled by the sequence control means E.

The gradient control means C includes an array of gradient field coils 30 for applying gradient magnetic fields across the image region at selectable angles. In the preferred embodiment, the gradients are selectively caused along three orthogonal axes designated as a slice select axis, a read axis, and a phase encode axis.

A first axis or slice select gradient control means or circuit 32 selectively applies electrical power to appropriate windings of the gradient coil assembly to generate gradient pulses 34 along a first or slice select axis. Commonly, the slice select axis extends along a central longitudinal axis of the image region or z-axis. Optionally, for three dimensional imaging, the first axis gradient control means may apply gradients of selectable height along the z-axis for phase encoding.

A second axis or read gradient control means 36 selectively applies appropriate current pulses to the gradient coil assembly to generate gradients 38 along a second or read gradient axis. The read gradient axis is commonly transverse to the z-axis, e.g. along the x-axis.

A third or phase encode gradient control means or circuit 40 selectively applies appropriate current pulses to the gradient coil assembly to induce gradients 42, 44 along a phase encode or third axis, e.g. along the y-axis. Typically, in each repetition of the image cycle, the phase encode gradients are applied with a different amplitude to create a different phase encoding along the third axis.

Magnetic resonance signals generated by the resonating nuclei are picked up by the RF antenna 20 and received by a receiver 50 of the image means D. A two dimensional fast Fourier transform means or other algorithm means 52 transform or reconstructs the received magnetic resonance signals into an electronic image representation. The image representation may be stored electronically in an image memory 54. The image representation may be converted to a man-readable display by a video monitor 56, retained in memory, stored on tape, or subject to further processing as may be conventional in the art.

With continuing reference to FIGS. 1 and 2, the imaging sequence control means E includes a bundle number selection means 60 for selecting the number of RF pulses 24 per bundle or series 62. An intrabundle pulse spacing means 64 selects the interpulse time duration or space 66 between radio frequency pulses 24 within each bundle. It is to be appreciated that the intrabundle interpulse spacing need not necessarily be constant within a given bundle. An RF pulse amplitude means 68 selects the amplitude of each RF pulse 24. Again, all RF pulses within a given bundle need not have the same amplitude. For example, a high amplitude pulse may immediately precede other RF excitation pulses to suppress the effects of flowing matter. An interbundle spacing or time interval means 70 selects or sets the time interval or duration 72 between adjacent bundles 62.

A slice select gradient profile selecting means 80 selects the profile of the slice select gradient pulses 34. In particular, each slice select gradient pulse has a pulse portion of a given polarity which is applied concurrently with one of the RF pulses for incorporating the appropriate slice selection encoding in the resultant magnetic resonance. Other portions of the slice select gradient are of opposite polarity so as to suitably manipulate the net phase of the transverse magnetization. A read gradient profile selection means 82 controls the profile of the read gradient 38. A phase encode means 84 causes the phase encode gradient 42 to be applied prior to the steady state echo 96 and the phase encode gradient 44 to be applied after data sampling. The phase encode gradient 42 selectively phase encodes the magnetization before data is sampled and the gradient 44 removes the effects of the phase encoding afterward so as not to degrade the data from the next sampled steady state echo. A central sequence control computer means 86 controls and sequences the resonance excitation means 22 and the gradient control means 32, 36, and 40 in accordance with the selected timing and pulse profile.

In operation, the nuclear spin system is subjected to the periodic application of the RF pulses 24 until a steady state is established. In the steady state, the free induction decay or other magnetic resonance signals 90 have substantially the same profile between each pair of radio frequency pulses. That is, the magnetization vector shows the same motion during any pulse period. Transverse magnetization decays from the start 92 of the period to a minimum near the center of the period. A partial recovery of the transverse magnetization 94 is observed toward the end. In the prior art steady state fast imaging techniques, a subsequent RF pulse is applied before the recovery can build to a steady state echo. A conventional gradient reversal echo formation technique was utilized to induce an echo for data sampling. To monitor the steady state signal 90 in the prior art techniques, it was necessary to fit the slice select, read, and phase encode gradients in the intrapulse interval 66.

In the present invention, the radio frequency pulses 24 are applied concurrently with a slice select pulse until the steady state is reached. The bundle is then terminated and the interbundle duration 72 commences and extends a sufficient duration for a steady state echo 96 to occur. During the next partial recovery 94, the application of radio frequency pulses 24 is recommended to maintain the spin system or magnetization in the steady state. The sampled data provides one view or data line for the Fourier transform means 52. The sequence is cyclically repeated in a continuum. The syncopation is cyclically repeated. In each cycle, analogous gradients are applied, but with a different phase encoding. The sequence is repeated until views with each of the phase encodings for the image transformation algorithm have been acquired.

The formation of a steady state echo is independent of the application of magnetic field gradients. That is, the coherence of the magnetization is predominantly controlled and manipulated by the radio frequency pulses. Unlike gradient echoes, steady state echoes formed by the radio frequency excitation exhibit self compensation for chemical shift, main field inhomogeneity, magnetic susceptibility variations, the effects of nearby ferrous objects, and the like. The images generated from the collected data benefit from this self compensation in the form of reduced artifacts.

In the preferred embodiment illustrated in FIG. 2, the RF pulse bundle 62 includes three RF pulses of equal intensity and intrabundle spacing 66. The bundles are spaced such that the interbundle spacing 72 permits the steady state echo 96 to form with its maximum intensity centered between adjacent RF pulses. More specific to the preferred embodiment, the interpulse spacing 72 is twice the intrapulse spacing 66. Slice select magnetic field gradients 34 are applied concurrently with the RF pulses. The read gradient 38 is centered on the steady state echo, i.e. centered between the adjacent bundle 62. Other portions of the read gradient are of opposite polarity so as to suitably manipulate the net phase of the transverse magnetization. The phase encoding gradients 42 are applied prior to steady state echo formation. A phase encode gradient of equal but opposite magnitude is applied after each steady state echo formation again to maintain the phase coherence of the steady state magnetic resonance signals.

It is to be appreciated that the number of RF pulses per bundle may be altered from a minimum of two to a large finite maximum. The characteristics of the steady state echo, hence, the resultant image, vary as a function of the number of intrabundle RF pulses and the spin systems characteristic relaxation times. The intensities of the individual RF pulses within the bundle may vary from each other to alter the overall image contrast. Changing the intensity of the RF pulses can also change the contrast of selected elements within the image, such as vessels with flowing blood, or other moving or accelerating tissue substances.

The interval 72 between the bundles may be selected longer than twice the intrabundle, interpulse spacing to accommodate a plurality of steady state echoes in each interbundle interval 72. Similarly, the position and shape of the applied gradients may be selected in order to change the amount and type of control which they have over the phase coherence of the steady state magnetic resonance signals. For example, any of the imaging gradients may be modified to selectively change the added phase of all or a portion of the transverse magnetization experiences during a selected time period to change the image characteristics.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A method of magnetic resonance imaging comprising:
    (a) establishing a steady state resonance condition;
    (b) intermittently permitting a steady state echo to occur by interrupting the radio frequency pulses;
    (c) sampling magnetic resonance data during the echo;
    (d) maintaining the steady state condition by applying radio frequency pulses with an interpulse interval that is shorter than the sample relaxation time;
    (e) repeating steps (b), (c), and (d) with a plurality of magnetic field gradients to collect a plurality of magnetic resonance data samplings; and,
    (f) transforming an image representation from the plurality of samplings.

2. The method as set forth in claim 1 the step of establishing a steady state resonance condition includes applying radio frequency pulses each having a common intensity and spaced from each other with a common interpulse interval.

3. The method as set forth in claim 2 wherein in the step of permitting the steady state echo to occur, the radio frequency pulses are interrupted for twice the interpulse interval.

4. The method as set forth in claim 3 wherein in the step of maintaining the steady state condition, the applied radio frequency pulses have the common intensity and the common interpulse interval.

5. The method as set forth in claim 4 wherein in the step of maintaining the steady state condition, three radio frequency pulses are applied before another steady state echo is permitted to occur.

6. The method as set forth in claim 1 further including during the step of permitting the steady state echo to occur, applying a phase encode gradient pulse.

7. The method as set forth in claim 6 further including during the step of permitting the steady state echo to occur, applying a second phase encode gradient pulse between the steady state echo and the applying of a next radio frequency pulse.

8. The method as set forth in claim 6 wherein the step of permitting the steady state echo to occur further includes applying a first read gradient pulse concurrently with the steady state echo.

9. The method as set forth in claim 6 further including applying a slice select gradient pulse concurrently with each radio frequency pulse.

10. A magnetic resonance method comprising:
    (a) establishing a generally uniform magnetic field through an examination region;
    (b) applying a first bundle of radio frequency pulses to the examination region to establish a steady state magnetic resonance condition;

(c) after application of the bundle of pulses, permitting at least one steady state echo to occur;

(d) sampling magnetic resonance data during the echo; and, (e) applying a further bundle of radio frequency pulses to maintain the steady state conditions;

(f) repeating steps (c), (d), and (e).

11. The method as set forth in claim 10 further including applying a read gradient contemporaneously with the steady state echo.

12. The method as set forth in claim 10 further including applying a phase encode gradient preceding the steady state echo.

13. The method as set forth in claim 10 further including applying a slice select gradient concurrently with each radio frequency pulse.

14. The method as set forth in claim 10 further including applying at least one imaging gradient that has balanced negative and positive polarity portions.

15. A method of magnetic resonance imaging comprising:

(a) establishing a steady state magnetic resonance condition;

(b) after establishing the steady state condition, applying a phase encode gradient;

(c) after applying the phase encode gradient, and while maintaining the steady state condition, permitting a steady state echo to occur and applying a read gradient concurrently with the steady state echo;

(d) sampling magnetic resonance data during the steady state echo;

(e) cyclically repeating steps (b), (c), and (d) with a plurality of magnetic field gradients to collect a plurality of magnetic resonance data samplings; and, (g) transforming an image representation from the plurality of samplings.

16. The method as set forth in claim 15 further including after step (d) applying another phase encode gradient of opposite polarity to maintain phase coherence.

17. The method as set forth in claim 16 further including in each cycle applying other read gradient portions so as to maintain phase coherence.

18. The method as set forth in claim 15 wherein at least one of the read and slice select gradients have balanced negative and positive polarity portions.

19. A magnetic resonance imaging apparatus comprising:

a main magnetic field means for generating an generally uniform magnetic field longitudinally through an image region;

a radio frequency transmitter means for transmitting radio frequency magnetic resonance excitation pulses into the image region;

a radio frequency receiver means for receiving magnetic resonance signals from the image region;

a gradient field means for selectively applying magnetic field gradients across the image region;

a transform means for selectively transforming received resonance signals into an image representation; and, an imaging sequence control means for alternately:

causing the radio frequency transmitter means to apply a bundle of radio frequency pulses with an interpulse interval that is too short for steady state echoes to occur until a steady state resonance condition is achieved;

stopping the radio frequency transmitter means for transmitting the radio frequency pulses for a sufficient duration that at least one steady state echo occurs.

* * * * *